US009780552B2

(12) United States Patent
Kimoto et al.

(10) Patent No.: US 9,780,552 B2
(45) Date of Patent: Oct. 3, 2017

(54) ELECTRIC-WIRE PROTECTION DEVICE

(71) Applicant: SUMITOMO WIRING SYSTEMS, LTD., Yokkaichi, Mie (JP)

(72) Inventors: Kazuhiro Kimoto, Yokkaichi (JP); Hidemasa Yoshida, Toyota (JP); Takaki Ito, Toyota (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 331 days.

(21) Appl. No.: 14/374,026

(22) PCT Filed: Jan. 25, 2013

(86) PCT No.: PCT/JP2013/051661
§ 371 (c)(1),
(2) Date: Nov. 18, 2014

(87) PCT Pub. No.: WO2013/115112
PCT Pub. Date: Aug. 8, 2013

(65) Prior Publication Data
US 2015/0116883 A1    Apr. 30, 2015

(30) Foreign Application Priority Data
Jan. 31, 2012   (JP) .................................. 2012-019107

(51) Int. Cl.
*H02H 3/08*     (2006.01)
*B60R 16/02*    (2006.01)
(Continued)

(52) U.S. Cl.
CPC ............... *H02H 3/08* (2013.01); *B60R 16/02* (2013.01); *G01K 1/20* (2013.01); *G01K 13/00* (2013.01);
(Continued)

(58) Field of Classification Search
CPC . H02H 3/08; H02H 5/04; G01K 13/00; G01R 19/0092
See application file for complete search history.

(56) References Cited

U.S. PATENT DOCUMENTS

| | | |
|---|---|---|
| 2002/0036481 A1 | 3/2002 | Nagase |
| 2011/0019325 A1 | 1/2011 | Nakamura |
| 2011/0043958 A1 | 2/2011 | Nakamura et al. |

FOREIGN PATENT DOCUMENTS

| | | |
|---|---|---|
| JP | A-2009-142146 | 6/2009 |
| JP | A-2010-158108 | 7/2010 |
| JP | A-2011-007600 | 1/2011 |

OTHER PUBLICATIONS

Feb. 19, 2013 International Search Report issued in International Application No. PCT/JP2013/051661.

*Primary Examiner* — Thienvu Tran
*Assistant Examiner* — Tien Mai
(74) *Attorney, Agent, or Firm* — Oliff PLC

(57) ABSTRACT

An electric-wire protection device that protects an electric wire by cutting off power to the wire when its temperature is elevated above a predetermined value is presented. The device includes switching means to control the conduction of power to the wire, current measuring means to measure a current in the wire, environment temperature detecting means to detect a temperature of the environment surrounding the wire, electric-wire temperature calculating means to calculate the temperature of the wire using the value of the current in the wire and the environment temperature, limiting means to stop the conduction of power to the wire when the temperature is greater than or equal to a predetermined value, peripheral component current measuring means to measure the current flowing to a component at the periphery of the environment temperature detecting means, thermal influence acquisition means to obtains an amount of tem- (Continued)

perature increase caused by the component at the environment temperature detecting means, and environment temperature correcting means to correct the environment temperature based on the amount of temperature increase.

4 Claims, 2 Drawing Sheets

(51) Int. Cl.
| | |
|---|---|
| *G01K 1/20* | (2006.01) |
| *H02H 5/04* | (2006.01) |
| *H02H 6/00* | (2006.01) |
| *H02H 7/26* | (2006.01) |
| *H02J 1/00* | (2006.01) |
| *G01K 13/00* | (2006.01) |
| *G01R 19/00* | (2006.01) |

(52) U.S. Cl.
CPC ........... *G01R 19/0092* (2013.01); *H02H 5/04* (2013.01); *H02H 6/005* (2013.01); *H02H 7/268* (2013.01); *H02J 1/00* (2013.01)

ELECTRIC-WIRE PROTECTION DEVICE

This application claims priority to JP 2012-019107 filed in Japan on Jan. 31, 2012, the entire disclosures of which is hereby incorporated by reference in its entirety.

TECHNICAL FIELD

Preferred embodiments of this disclosure relate to an electric-wire protection device that protects an electric wire connected to a load by cutting off conduction of power to the electric wire when an excessive current flows through the electric wire, elevating the electric-wire temperature.

BACKGROUND

Conventionally, in a vehicle such as an automobile, in order to supply a power source such as a battery to various loads such as lights and motors, electric wires are used to connect the power source with each load. Due to vibrations caused by a traveling vehicle, these electric wires may contact a portion of a vehicle body. Furthermore, when the insulation coatings of the electric wires are damaged due to this contact, there is a possibility that an electrical short circuit or a current leak may be generated with the vehicle body. Such a current leak or full short circuit may cause the temperature of the damaged portion to increase, and insulation coatings may eventually emit smoke.

SUMMARY

In order to suppress such smoke generation when electric wires are damaged, an electric-wire protection device is used as described in, for example, Japanese Published Patent Application 2009-261088 (Patent Reference 1). Such an electric-wire protection device is provided with switching means that controls conduction and cutting off conduction of power to electric wires connected to a load, and electric-wire current means that measures a value of electric current that flows through the electric wires, calculates electric-wire temperature, based on the value of the electric current that flows through the electric wires, and cuts off conduction of power to the electric wires by the switching means when the calculated electric-wire temperature is greater than or equal to a specified threshold value. Incidentally, in the electric-wire protection device described in Patent Reference 1, the following general equation showing electric-wire temperature at the time of heat generation is used to calculate the electric-wire temperature Tw (° C.).

$$Tw = Ta + I^2 \times Rw \times Rthw \times \{1 - \exp(-t/C \cdot Rthw)\}$$

Here, Ta refers to environment temperature (° C.) of the environment surrounding an electric wire, I refers to a value of the electrical current (A) that flows through the electric wire, Rw refers to conductive resistance (Ω) of the electric wire, Rthw refers to heat resistance (° C./W), C refers to a thermal capacity (J/° C.), and t refers to time (s).

Here, the environment temperature Ta of the environment surrounding the electric wire is detected by environment temperature detecting means, for example, a temperature sensor or the like. However, if the temperature sensor is arranged in the vicinity of a heat-generating electrical component such as a relay, resistance, or the like, it is affected by heat generated by the electrical component, and there is a possibility that a value higher than the actual environment temperature will be detected. Because of this, there was a possibility of cutting off conduction of power to the electric wire at a stage much earlier than the stage at which the electric wire would reach the smoke-emitting temperature. As a result, a margin that is more than necessary was given to a diameter of the electric wire, and there was an intrinsic problem of increasing the manufacturing cost.

PRIOR ART REFERENCE

Patent Reference 1: Japanese Published Patent Application 2009-261088

SUMMARY

Preferred embodiments of this disclosure overcome at least some the above-mentioned issues. To solve the problem, an object of some embodiments is to provide an electric-wire protection device with a novel structure that more accurately detects the temperature of the environment surrounding an electric wire so as to more accurately detect a temperature abnormality of the electric wire.

In a first mode, an electric-wire protection device that protects an electric wire that connects a power source and a load by cutting off conduction of power to the electric wire when temperature of the electric wire increases is provided with:

(a) switching means that switches between conduction of power to the electric wire and cutting off conduction of power;

(b) electric-wire current measuring means that measures a value of electric current that flows through the electric wire;

(c) environment temperature detecting means that detects temperature of an environment surrounding the electric wire;

(d) electric-wire temperature calculating means that calculates the temperature of the electric wire, using (i) the value of electric current that flows through the electric wire that has been obtained by the electric-wire current measuring means and (ii) the environment temperature that has been obtained by the environment temperature detecting means;

(e) limiting means that cuts off conduction of power to the electric wire by the switching means when the temperature of the electric wire that has been calculated by the electric-wire temperature calculating means is greater than or equal to a specified value;

(f) peripheral component current measuring means that measures the value of electric current that flows to an electric component arranged at the periphery of the environment temperature detecting means;

(g) thermal influence acquisition means that obtains, from the value of electric current that flows to the electric component that has been obtained by the peripheral component current measuring means, an amount of temperature increase that the electric component causes at the environment temperature detecting means; and (h) environment temperature correcting means that corrects the environment temperature that has been obtained by the environment temperature detecting means, based on the amount of temperature increase that has been obtained by the thermal influence acquisition means.

In an electric-wire protection device that has a structure in accordance with some embodiments, by arranging the thermal influence acquisition means, a thermal influence that an electric component, arranged at the periphery of the environment temperature detecting means such as a temperature sensor, causes at the environment temperature detecting means is obtained, and environment temperature obtained by the environment temperature detecting means is corrected based on the obtained thermal influence. By so doing, the thermal influence that the electric component arranged in the periphery causes at the environment temperature detecting means can be removed, and the environment temperature can be more accurately detected. Thus, the electric-wire temperature can be more accurately calculated, and conduction of electric current can be cut off at a more appropriate timing closer to the smoke-emitting temperature. As a result, an unnecessary margin is not given to the diameter of an electric wire, the electric-wire diameter can be made smaller, and the manufacturing cost can be reduced. Furthermore, there is no need for arranging the environment temperature detecting means distant from the electric component in order to reduce the thermal influence from the electric component, and the environment temperature detecting means can more accurately detect the environment temperature even if it is positioned in the vicinity of the electric component. Thus, the environment temperature detecting means can be arranged close to the electric component, and the device can be made smaller.

Additionally, as described hereafter, in the thermal influence acquisition means, the relationship between the value of electric current that flows to the electric component in the vicinity of the environment temperature detecting means and the amount of temperature increase that the electric component causes at the environment temperature detecting means can be arranged as a data table in advance, and the relationship can be searched from the table. Alternatively, by preparing a function, the amount of temperature increase of the environment temperature detecting means can be also calculated from the value of electric current that flows to the electric component.

In a second mode, in the apparatus described in the first mode, the switching means is constituted by a relay as the electric component that is arranged at the periphery of the environment temperature detecting means.

In this second mode, the switching means is constituted by a relay. Furthermore, a relay easily generates heat, so a thermal influence can easily be given to the environment temperature detecting means. By removing, from the environment temperature detected by the environment temperature detecting means, the amount of the thermal influence that is given to the environment temperature detecting means by the relay, the environment temperature can be accurately detected.

Additionally, a mechanical relay having a mechanical contact, a semiconductor relay, or the like can be used as the relay. In particular, if an IPS (Intelligent Power Switch) or the like having a current sensing function is used, the switching means, electric-wire current measuring means, and peripheral component current measuring means can be constituted by a single component.

In a third mode, in the apparatus described in the first or second mode, the thermal influence acquisition means is provided with an electric current value-thermal influence relationship table that stores relationships between (i) the value of electric current that flows to the electric component that is arranged at the periphery of the environment temperature detecting means and (ii) the amount of temperature increase that the electric component causes at the environment temperature detecting means.

In this mode, by providing the relationship between the value of electric current that flows to the electric component and the amount of temperature increase that the electric component causes at the environment temperature detecting means as a data table in advance, the amount of temperature increase corresponding to the obtained electric current value is obtained from the table; thus, the thermal influence acquisition means can be constituted with a simplified structure. Additionally, the amount of temperature increase of the environment temperature detecting means can be promptly obtained, so the processing speed can be improved.

Effects of a Preferred Embodiment

In a preferred embodiment, there are provided (i) thermal influence acquisition means that acquires an amount of temperature increase that an electric component causes at environment temperature detecting means based on the value of electric current that flows to the electric component, which is arranged at the periphery of the environment temperature detecting means, and (ii) environment temperature correcting means that corrects a detection result of the environment temperature detecting means, based on the amount of temperature increase obtained by the thermal influence acquisition means. Thus, a thermal effect that is received by the environment temperature detecting means from the surrounding electric component can be removed so as to be able to more accurately detect the environment temperature, and conduction of power to an electric wire can be cut off at an appropriate timing closer to the smoke-emitting temperature. As a result, the diameter of the electric wire can be made smaller without giving it an unnecessary margin, the environment temperature detecting means can be arranged close to the electric component, and the electric-wire protection device can be also made smaller.

EXPLANATION OF SYMBOLS

10: Electric-wire protection device, Ba: Power source, 12a-12c: Loads, 14a-14c: Electric wires, 16: Semiconductor relay (switching means), 24: Temperature sensor (environment temperature detecting means), 26a-26c: IPSs (electric components arranged at the periphery), 34: Sense MOSFET (electric-wire current measuring means, peripheral component current measuring means).

DETAILED DESCRIPTION

Figure 1:
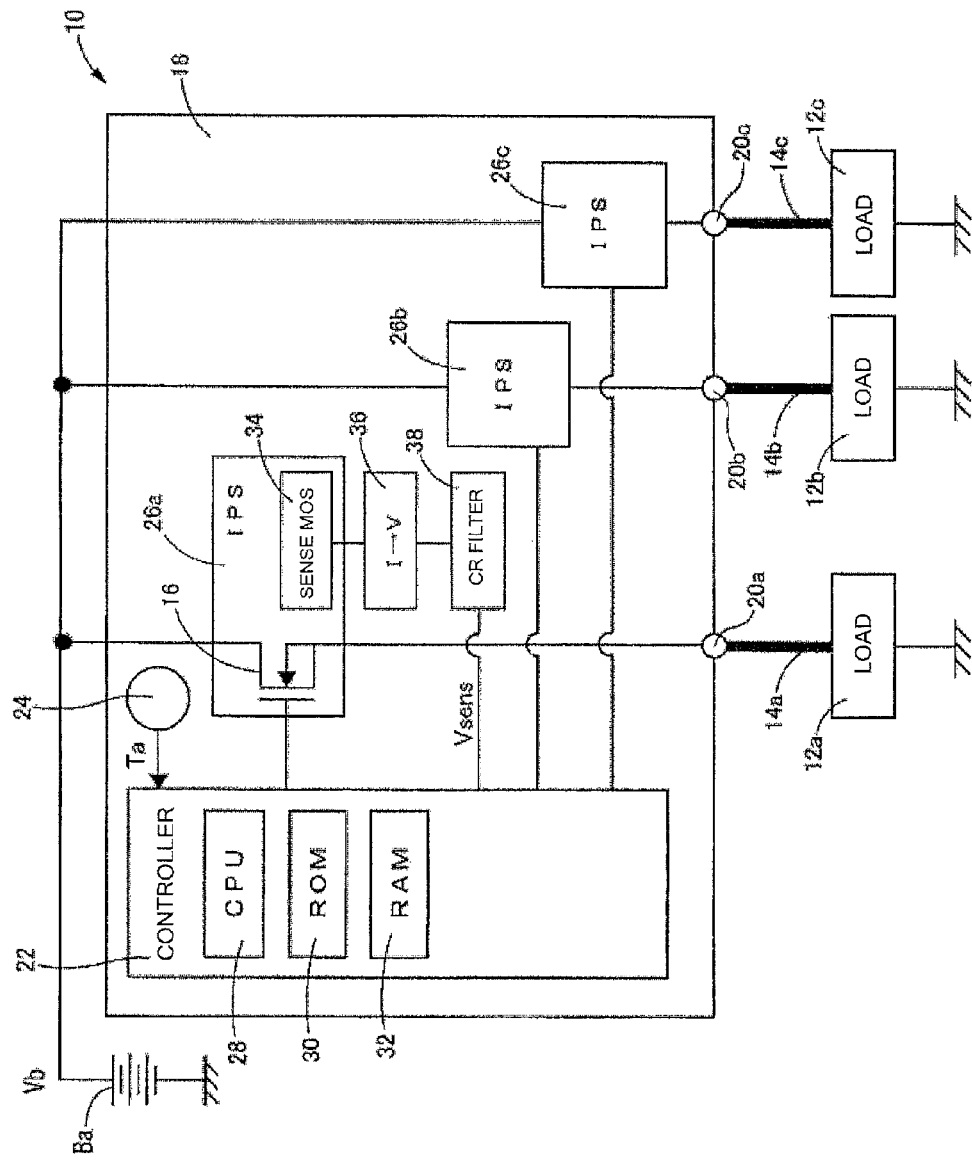
FIG. 1 is a block diagram explaining a schematic structure of an electric-wire protection device in a preferred embodiment.

First, FIG. 1 shows a schematic structure of an electric-wire protection device 10 as a preferred embodiment. The electric-wire protection device 10 is arranged within a power distributor mounted on, for example, an undepicted vehicle, and controls an electric power supply to various loads 12 (only three loads 12a-12c are depicted in this embodiment) from a power source Ba. Additionally, the power source Ba is a battery. The loads 12 are various types of electrical components or the like, and for example, a vehicle lamp, a cooling fan motor, a defogger heater, or the like can be listed.

The electric-wire protection device 10 is provided with semiconductor relays 16, as switching means, that are connected to electric wires 14a-14c that connect the power source Ba and the respective loads 12a-12c (FIG. 1 only shows the semiconductor relay 16 that is connected to the electric line 14a) and switches between conduction of power to the electric wires 14a-14c and cutting off conduction of power by turning the semiconductor relay 16 on and off so as to control an electric power supply to each load 12a-12c from the power source Ba. The electric-wire protection device 10 is formed on a printed board 18, and the semiconductor relay 16 is, for example, a power MOSFET or the like. Additionally, the electric wires 14a-14c are wire harnesses, for example, in which a conductive core wire is covered with an insulation coating and is electrically connected to the semiconductor relay 16 by connectors 20a-20c arranged on the printed board 18. Additionally, in the electric-wire protection device 10, substantially the same structure is used for a route connecting the power source Ba and each load 12a-12c. Thus, unless there is particular need for distinguishing from each other, they are explained as the loads 12 and the electric wires 14.

In the electric-wire protection device 10, there are provided a controller 22, a temperature sensor 24 as an environment temperature detecting means, and a plurality of IPSs (Intelligent Power Switches) 26a-26c that are each provided with the semiconductor relay 16 or the like.

The controller 22 is a microcomputer and is constituted so as to include (i) a CPU 28 that performs necessary calculations for an electric-wire protection process that will be described hereafter, (ii) a ROM 30 that stores a program that controls an operation of the CPU 28, and a current value-thermal influence relationship table or the like that will be described later, and (iii) a RAM 32 that is used for a temporary memory area for calculation results or the like of the CPU 28. Additionally, in this embodiment, the controller 22 is mounted on the printed board 18 as well as the IPSs 26a-26c or the like, but, for example, the controller 22 can be constituted separately from the printed board 18.

The temperature sensor 24 is, for example, a thermistor arranged on the printed board 18. The temperature sensor 24 detects environment temperature Ta surrounding the electric wires 14 and transmits it to the controller 22.

The IPSs 26a-26c are arranged at the electric wires 14a-14c, respectively. These IPSs 26 are semiconductor relays and are constituted so as to include the semiconductor relay 16 (for example, n channel MOSFET) and a sense MOSFET 34. The sense MOSFET 34 generates a sense current having an electric current value I that is a conducted electric current from the power source Ba to the loads 12 and a specified ratio relationship.

The sense current is converted to a sense voltage signal (converted signal) Vsens having a proportional relationship to the sense current by a current-voltage conversion circuit 36. The current-voltage conversion circuit 36 is constituted by, for example, a sense current detection resistance. The sense voltage signal Vsens is transmitted to a CR low-pass filter 38. The CR low-pass filter 38 removes a specified high-frequency component from the sense voltage signal Vsens and transmits to the controller 22 the sense voltage signal Vsens from which the high-frequency component has been removed. Additionally, although undepicted, the current-voltage conversion circuit 36 and the CR low-pass filter 38 are arranged on the printed board 18 for each of the IPSs 26 and are connected to the IPSs 26b and 26c in the same manner.

The controller 22 obtains a current value I that is a conducted current of the loads 12, based on the received sense voltage signal Vsens. For example, a data table showing how the sense voltage signal Vsens corresponds to the current value I is stored in the ROM 30, and the current value I corresponding to the sense voltage signal Vsens that has been received is obtained from the data table.

These IPSs 26a-26c are arranged on the printed board 18 along with the temperature sensor 24, and are arranged at the periphery of the temperature sensor 24. Therefore, in this embodiment, the IPSs 26a-26c are electric components arranged at the periphery of the temperature sensor 24, which is an environment temperature detecting means, and both the electric-wire current measurement means that measures a value of electric current that flows through the electric wires 14 and the peripheral component current measurement means that measures the value of electric current that flows to the IPSs 26 as electric components are constituted so as to include the sense MOSFET 34.

Furthermore, a current value-thermal influence relationship table shown in Table 1 is stored in the ROM 30 of the controller 22. The current value-thermal influence relationship table is a data table that stores the amount of temperature increase as a thermal influence given by generated heat of the respective IPSs 26a-26c to the temperature sensor 24 when a specified current value flows to the respective IPSs 26a-26c. Additionally, the current value-thermal influence relationship table can be obtained, for example, by actually conducting power to the respective IPSs 26a-26c, measuring the amount of temperature increase detected by the temperature sensor 24, or the like, while the temperature sensor 24 and the IPSs 26a-26c are mounted on the printed board 18.

TABLE 1

| Conducted Current (I) | Temperature Increase (° C.) at Temperature Sensor | | |
|---|---|---|---|
| | IPS 26a | IPS 26b | IPS 26c |
| 1A | 0.3 | 0.2 | 0.5 |
| 2A | 0.6 | 0.4 | 1.0 |
| 3A | 0.9 | 0.6 | 1.5 |
| 4A | 1.2 | 0.8 | 2.0 |
| 5A | 1.5 | 1.0 | 2.5 |
| 6A | 1.8 | 1.2 | 3.0 |
| 7A | 2.1 | 1.4 | 3.5 |
| 8A | 2.4 | 1.6 | 4.0 |
| 9A | 2.7 | 1.8 | 4.5 |
| 10A | 3.0 | 2.0 | 5.0 |

This type of electric-wire protection device 10 protects the electric wires 14 by turning off the semiconductor relays 16 that are connected to the electric wires 14 and cutting off conduction of power to the electric wires 14 when short-circuiting is generated in the electric wires 14 due to deterioration of an insulation coating or the like, and the electric wire temperature Tw increases to a pre-set cutting-off threshold value Tth. The cutting-off threshold value Tth is set at a value slightly lower than the smoke-emitting temperature, based on a smoke-emitting characteristic of the electric wires 14.

Figure 2:
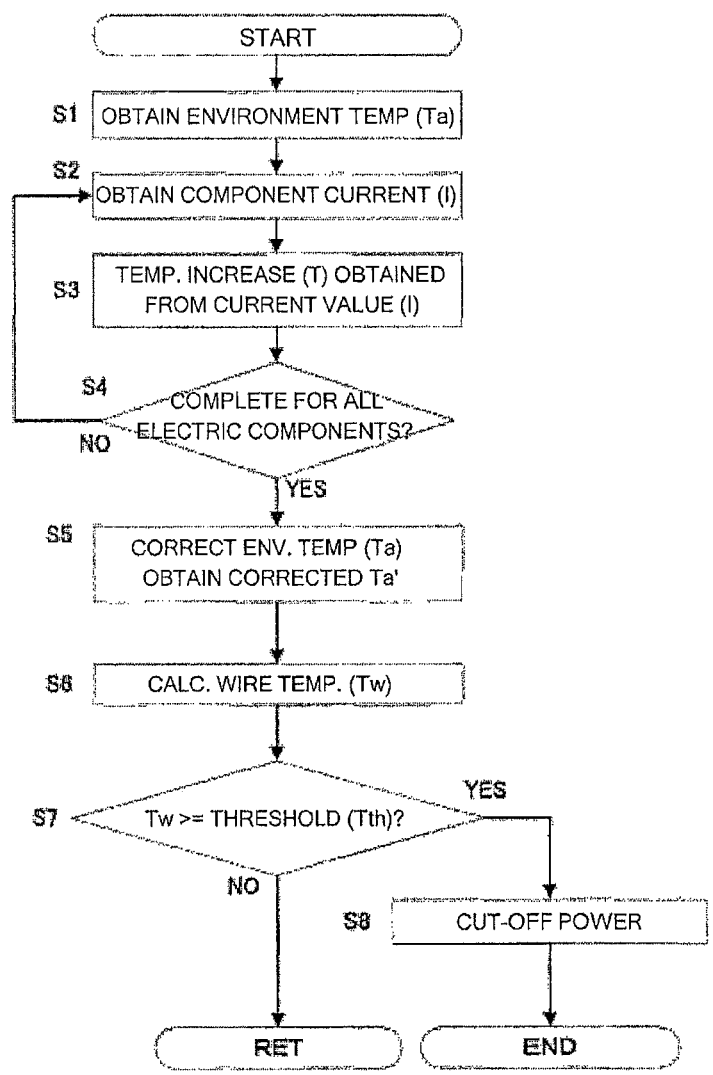
FIG. 2 is a flowchart showing an electric-wire protection process implemented by an electric-wire protection device.

Next, based on FIG. 2, an electric-wire protection process is shown, which is executed by the CPU 28 arranged in the controller 22. FIG. 2 shows a process for one electric wire 14, and this electric-wire protection process is executed for all of the electric wires 14 connected to the respective loads 12 at, for example, a specified cycle such as 5 ms. First, in S1, the CPU 28 obtains the environment temperature Ta from the temperature sensor 24 and stores the environment temperature Ta in the RAM 32.

Next, in S2-S4, for all of the IPSs 26a-26c arranged at the periphery of the temperature sensor 24, the CPU 28 obtains the temperature increase amount T1-T3 as influence temperature that the respective IPSs 26a-26c give to the temperature sensor 24, based on the current value-thermal influence relationship table (see Table 1) stored in the ROM 30. Specifically, first, in S2, the CPU 28 obtains a value of electric current that flows to the IPS 26a via the sense MOSFET 34. Next, in S3, for the IPS 26a, the CPU 28 obtains the temperature increase amount T1 of the temperature sensor 24 corresponding to the obtained current value according to the current value-thermal influence relationship table and stores it in the RAM 32. For example, if the current value that has been obtained for the IPS 26a is 5 A, 1.5 (° C.) is stored in the RAM 32 as T1. Furthermore, S2 and S3 are executed in the same manner for the IPSs 26b and 26c, and the temperature increase amounts T2 and T3 are stored in the RAM 32. Thus, in this embodiment, the thermal influence acquisition means is constituted so as to include the current value-thermal influence relationship table and S2-S4.

When acquisition of the influence temperatures T1-T3 on the temperature sensor 24 for all of the IPSs 26a-26c is complete (S4=Yes), in S5, the CPU 28 obtains (i) environment temperature Ta that has been obtained in S1, and (ii) corrected environment temperature Ta' that has corrected the environment temperature Ta by the influence temperature T1-T3, based on the following equation 1, using the amounts of temperature increase T1-T3 of the respective IPSs 26a-26c that have been obtained in S2-S3 and stores it in the RAM 32.

$$Ta'=Ta-T1-T2-T3 \qquad \text{(Equation 1)}$$

For example, when the environment temperature Ta=30 (° C.), the value of electric current that flows to the IPS 26a is 5 A, the value of electric current that flows to the IPS 26b is 3 A, and the value of electric current that flows to the IPS 26c is 7 A, T1=1.5 (° C.), T2=0.6 (° C.), T3=3.5 (° C.), and the corrected environment temperature Ta'=30−1.5−0.6−3.5=24.4 (° C.). Thus, in this embodiment, the environment temperature correcting means is constituted so as to include S5.

Next, in S6, the CPU 28 calculates the electric-wire temperature Tw (CC) of the electric wire 14a, based on the following equation 2, using the corrected environment temperature Ta' that has been obtained in S5 and the value I of electric current that flows through the electric wire 14a. Thus, in this embodiment, electric-wire temperature calculating means is constituted so as to include S6. Furthermore, the value I of electric current that flows through the electric wire 14a is obtained via the sense MOSFET 34 of the IPS 26a.

$$Tw=Ta'+I^2 \times Rw \times Rthw \times \{1-\exp(-t/\tau w)\} \qquad \text{(equation 2)}$$

Here, Ta' is corrected environment temperature (° C.) that has been obtained in S5, I is a value of electric current (A) that flows through the electric wire, Rw is conductive resistance ($\Omega$) of the electric wire, Rthw is thermal resistance (° C./W), $\tau$W is a constant (s) when heat of the electric wire is discharged, and t is time (s).

Additionally, in S7, the CPU 28 compares the electric-wire temperature Tw (° C.) of the electric wire 14a that has been obtained in S6 and a specified cutting-off threshold value Tth (° C.) that is lower than the smoke-emitting temperature of the electric wire 14a, and if the electric-wire temperature Tw is smaller than the cutting-off threshold value Tth (S7=NO), again executes the processing from S1 in the next cycle. On the other hand, if the electric-wire temperature Tw is greater than or equal to the cutting-off threshold value Tth (S7=YES), in S8, the semiconductor relay 16 connected to the electric wire 14a is turned off, conduction of power to the electric wire 14a is cut off, and the electric-wire protection process is complete. Thus, in this embodiment, limiting means is constituted so as to include S7 and S8.

Furthermore, as mentioned above, this type of electric-wire protection processing is executed for all of the electric wires 14 connected to the loads 12 at every specified cycle. Thus, the above-mentioned S1-S8 can be repeatedly executed for all of the electric wires 14a-14c. If the electric-wire protection processing for the respective electric wires 14a-14c is executed at substantially the same timing, for example, after the corrected environment temperature Ta' is obtained by executing S1-S5 only once, it is also acceptable to repeatedly execute only the processing of S6 and after for the respective electric wires 14a-14c, using the obtained corrected environment temperature Ta' in common.

In the electric-wire protection device 10 whose structure corresponds to this embodiment, a current value-thermal influence relationship table (Table 1) that stores the relationships between the magnitude of the electric current that flows to the respective IPSs 26a-26c and the amount of temperature increase that the respective IPSs 26a-26c give to the temperature sensor 24 is provided within the ROM 30 of the controller 22. Additionally, in order to calculate the electric-wire temperature Tw of the electric wires 14, the temperature increase amounts T1-T3 that the respective IPSs 26a-26c give to the temperature sensor 24 are obtained, and the corrected environment temperature Ta' is used, which has subtracted the influence portions T1-T3 of the respective IPSs 26a-26c on the temperature sensor 24. By so doing, the environment temperature can be more accurately detected, and the electric-wire temperature Tw can be more accurately calculated. As a result, a current can be cut off at more appropriate timing, there is no need for giving an unnecessary margin to the electric wires 14, and diameters of the electric wires 14 can be made smaller. Additionally, even when the thermal influence is received from the IPSs 26a-26c, the environment temperature can be more accurately detected. Thus, the temperature sensor 24 can be arranged at a position close to the IPSs 26a-26c, and the electric-wire protection device 10 can be made smaller.

Furthermore, in this embodiment, the thermal influence acquisition means that obtains the amount of temperature increase given to the temperature sensor 24 from the value of the electric current that flows to the respective IPSs 26a-26c is constituted by the current value-thermal influence relationship table (Table 1), as a data table stored in the ROM 30, that stores relationships between the value of the electric current that flows to the respective IPSs 26a-26c and the amount of temperature increase of the temperature sensor 24. By so doing, the thermal influence acquisition means can be constituted with a simplified structure, and the amount of temperature increase of the temperature sensor 24 can be promptly obtained.

While some embodiments are described above in detail, other embodiments exist without limitation to those specific descriptions. For example, electric components that cause subtraction of a thermal influence portion from the detection result of environment temperature detecting means are not limited as long as they cause a thermal influence on the environment temperature detecting means. The embodiments are not limited to semiconductor relays such as the IPSs 26 discussed above, but can also include mechanical relays having a mechanical contact or resistance. Therefore, as for the electric components that cause subtraction of a thermal influence portion, for example, resistances or the like are also acceptable, which are simply arranged close to the environment temperature detecting means without electrically connecting electric wires to be protected.

Furthermore, in the above-mentioned embodiments, for peripheral component current measuring means that measures a value of electric current that flows to electric components, the sense MOSFET 34 was used, but, for example, a shunt resistance or the like can also be used.

Additionally, the thermal influence acquisition means that obtains, from the value of electric current that flows to the electric component, an amount of temperature increase that the electric component causes at the environment temperature detecting means is not limited to the data table described in the current value-thermal influence relationship table (Table 1) of the above-mentioned embodiments. For example, by holding, with a function, the relationship between (i) the value of current that flows to the electric component and (ii) the amount of temperature increase that the electric component causes at the environment temperature detecting means, the amount of temperature increase that affects the environment temperature detecting means can be obtained by calculation each time. By plotting several actual measurement values of the amount of temperature increase of the environment temperature detecting means at a specified current value, this type of function can be obtained by approximation curves going through these plots.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An electric-wire protection device that protects a primary electric wire that connects a power source and a load by cutting off conduction of power to the primary electric wire when a temperature of the primary electric wire increases, comprising:
    (a) switching means that switches between conduction of power to the primary electric wire and cutting off the conduction of power to the primary electric wire;
    (b) electric-wire current measuring means that measures a value of an electric current that flows through the primary electric wire;
    (c) environment temperature detecting sensor that detects a temperature of an environment surrounding the primary electric wire;
    (d) electric-wire temperature calculating means that calculates the temperature of the primary electric wire, using (i) the value of the electric current that flows through the primary electric wire, obtained by the electric-wire current measuring means, and (ii) the environment temperature, obtained by the environment temperature detecting sensor;
    (e) limiting means that cuts off the conduction of power to the primary electric wire via the switching means when the temperature of the primary electric wire, calculated by the electric-wire temperature calculating means, is greater than or equal to a predetermined value;
    (f) peripheral component current measuring means that measures a value of a peripheral electric current that flows to a peripheral electric component arranged at the periphery of the environment temperature detecting means;
    (g) thermal influence acquisition means that obtains an amount of temperature increase that the peripheral electric component causes at the environment temperature detecting sensor from the value of the electric current flowing to the peripheral electric component, the value of the electric current having been obtained by the peripheral component current measuring means; and
    (h) environment temperature correcting means that corrects the environment temperature by subtracting from the detected environment temperature an amount of increase contributed by the peripheral electric component based on the amount of temperature increase that has been obtained by the thermal influence acquisition means, the environment temperature having been obtained by the environment temperature detecting sensor.

2. The electric-wire protection device as set forth in claim 1, wherein the switching means is constituted by a relay as the electric component that is arranged at the periphery of the environment temperature detecting means.

3. The electric-wire protection device of claim 1, wherein the thermal influence acquisition means is provided with an electric current value-thermal influence relationship table that stores relationships between (i) the value of electric current that flows to the electric component that is arranged at the periphery of the environment temperature detecting means and (ii) the amount of temperature increase that the electric component causes at the environment temperature detecting means.

4. The electric-wire protection device of claim 2, wherein the thermal influence acquisition means is provided with an electric current value-thermal influence relationship table that stores relationships between (i) the value of electric current that flows to the electric component that is arranged at the periphery of the environment temperature detecting means and (ii) the amount of temperature increase that the electric component causes at the environment temperature detecting means.

* * * * *